(12) United States Patent
Kaplinsky

(10) Patent No.: US 6,212,591 B1
(45) Date of Patent: Apr. 3, 2001

(54) CONFIGURABLE I/O CIRCUITRY DEFINING VIRTUAL PORTS

(75) Inventor: Cecil H. Kaplinsky, Palo Alto, CA (US)

(73) Assignee: Cradle Technologies, Fremont, CA (US)

( * ) Notice: Subject to any disclaimer, the term of this patent is extended or adjusted under 35 U.S.C. 154(b) by 0 days.

(21) Appl. No.: 09/286,127

(22) Filed: Apr. 2, 1999

(51) Int. Cl.[7] .............................. G06F 13/40; G06F 13/12; H03K 19/173
(52) U.S. Cl. ................................. 710/129; 710/66; 326/38
(58) Field of Search ..................... 710/126–132, 710/62–74, 8–19; 326/37–41

(56) References Cited

U.S. PATENT DOCUMENTS

| | | |
|---|---|---|
| 3,648,065 | 3/1972 | Mukai et al. . |
| 4,716,313 | 12/1987 | Hori et al. . |
| 4,758,746 | 7/1998 | Birkner et al. ............... 307/465 |
| 4,969,121 | 11/1990 | Chan et al. ................... 364/900 |
| 5,086,238 | 2/1992 | Watanabe et al. . |
| 5,111,080 | 5/1992 | Mizukami et al. . |
| 5,185,706 | * 2/1993 | Agrawal et al. .............. 364/489 |
| 5,369,317 | 11/1994 | Casper et al. . |
| 5,459,412 | 10/1995 | Mentzer . |
| 5,469,081 | 11/1995 | Horita et al. . |
| 5,510,729 | 4/1996 | Reymond . |
| 5,572,148 | * 11/1996 | Lytle et al. .................... 326/41 |
| 5,644,245 | 7/1997 | Taylor . |
| 5,661,416 | 8/1997 | Takada et al. . |
| 5,729,154 | 3/1998 | Taguchi et al. . |
| 5,804,985 | 9/1998 | Shieh et al. ................... 326/39 |
| 5,867,672 | * 2/1999 | Wang et al. ................... 710/127 |
| 5,872,463 | 2/1999 | Pedersen ....................... 326/41 |
| 5,933,023 | * 8/1999 | Young ........................... 326/40 |
| 6,011,730 | * 1/2000 | Sample et al. ................. 365/189.05 |

FOREIGN PATENT DOCUMENTS

| | | |
|---|---|---|
| 0 432 280 A1 | 6/1991 | (EP) . |
| 0 517 375 A2 | 12/1992 | (EP) . |

OTHER PUBLICATIONS

European Search Report, Feb. 18, 1999.

* cited by examiner

*Primary Examiner*—Sumati Lefkowitz
(74) *Attorney, Agent, or Firm*—Thomas Schneck

(57) ABSTRACT

Configurable I/O circuitry having a plurality of configurable input/output elements, each of which connects one of a plurality of bits of a data bus to a corresponding one of the input/output terminals. Multiple clock selects and programmable enable signals can be connected to different interface elements to control activation of the interface element to which it is connected. The activated interface elements make up a virtual port that can be of any arbitrary bit width that is less than or equal to the fixed width of a physical port. This allows virtual ports on the data bus to be constructed that are narrower than the physical ports so that narrower data can be utilized in the port without causing the potential use of any of the data pins to be lost.

20 Claims, 6 Drawing Sheets

CONFIGURABLE I/O CIRCUITRY DEFINING VIRTUAL PORTS

TECHNICAL FIELD OF THE INVENTION

The present invention relates to micro-controllers, and more specifically to connection of a data bus to input/output terminals.

BACKGROUND OF THE INVENTION

Many micro-controllers have ports which allow programmers to move data on to and off of the chip. Typically, these ports are connected by a bus to the rest of the system as shown in FIG. 7. In the prior art system 100 of FIG. 7, the processor 112 is connected to fixed width (16 bit) ports by means of a bus which consists of two portions, a data bus 110 and an address bus 111. The address on the address bus 111 is decoded by one of the decoders 120 and enables an input or an output port. The addresses corresponding to these ports are fixed. Input data is received at one of the input/output (I/O) pads 180 and proceeds through a buffer 136 to an input register 128. Clocks 115 and other signals are input into a multiplexer 116 which supplies the input register 128. The clocks 115 and other signals received at the input register 128 can be selected from a variety of sources which can be internal or external to the micro-controller. An enable signal 140 from one of the decoders 120 enables the input data to pass through a tri-state buffer 124 and to be received at the data bus 110. Output data, being transferred from the data bus 110 to the I/O pads 180, first passes into one of the output latches 132. An output enable signal 141 from one of the decoders 120 enables the output data to pass from the latch 132 through a buffer 138 to the I/O pad 180. The output latches 132 and input registers 128 provide storage and can be substituted with other types of storage means, such as a FIFO register.

While the prior art system of FIG. 7 works well for data that is 16 bits wide, it is not very efficient for narrower data. For instance, if the micro-controller was reading data from a 10 bit wide CCD imaging device, then it would have to dedicate an entire 16 bit port to the input and, although only 10 pins are used, the other six pins of the port can not be used for any other purpose and are effectively lost. In FIG. 8, only the input ports of the prior art are shown, the output ports being essentially similar to the input ports except that an enabled latch may be used in place of a register, as in FIG. 7. In the prior art, all of the bits in a byte (8 bits) have the same clock signal and also the same fixed enable signal on to the bus. Therefore, there are at most two fixed enable signals and two clock selection mechanisms per port. In the port of FIG. 8, a first enable signal 143 and a first clock select signal 151 control the bits 0–7 of the data bus 110, while a second enable signal 144 and a second clock select signal 152 control the bits 8–15 of the data bus 110. In cases where there is only one fixed enable, the port has to be read from and written to as a 16 bit entity. Thus, in the prior art, unless the data is constructed in 8 bit or 16 bit entities, there will be extra unused pins in the port and the maximum capabilities of the port will not be fully utilized.

U.S. Pat. No. 4,758,746 to Birkner et al. provides a programmable logic array with individually programmable output pins to allow output terms to be routed via a programmable bus to selected pins. U.S. Pat. No. 5,872,463 to Pederson discloses a programmable logic device wherein each output bus conductor is connectable to one or more output drivers in order to make efficient use of the drivers that are provided. U.S. Pat. No. 5,804,985 to Shieh et al. discloses an output bus with 16 different output configurations for providing the proper signalling interface to peripheral devices. However, only one enable signal is provided to the device.

It is the object of the present invention to provide configuration circuitry to define virtual ports on a data bus that can be narrower than the physical ports so that narrower width data can be accepted by the virtual ports without causing the use of any data pins to be lost.

It is a further object of the invention to provide configuration circuitry that defines virtual ports that can span across two physical ports to allow greater flexibility in the use of the pins of the micro-controller.

SUMMARY OF THE INVENTION

The above objects have been achieved by configuration circuitry for an integrated circuit having a plurality of configurable input/output interface elements, each of which connects one of a plurality of bits of the data bus to a corresponding one of the input/output terminals. Multiple clock selects and programmable enables can be connected to different interface elements and each of the clocks and programmable enables are configured to control the activation of the interface element to which it is connected. The activated interface elements make up a virtual port that can be of any arbitrary bit width that is less than or equal to the fixed bit width of a physical port.

The inventive configuration circuitry allows multiple virtual ports with a width ranging from one to 16 bits to be programmed. Also, if two physical ports are available, a virtual port can be made from some high order bits of one port and some low order bits of the second port. Thus, virtual ports can be constructed starting at arbitrary bit positions and having arbitrary widths up to the width of the data bus, which allows greater flexibility in the use of the pins of the micro-controller.

BRIEF DESCRIPTION OF THE DRAWINGS

FIG. 3A is a diagram of a virtual port prior to the rotation of the bits.

FIG. 3B is a diagram of the virtual port of FIG. 3A after the rotation of the bits.

BEST MODE FOR CARRYING OUT THE INVENTION

Figure 1:
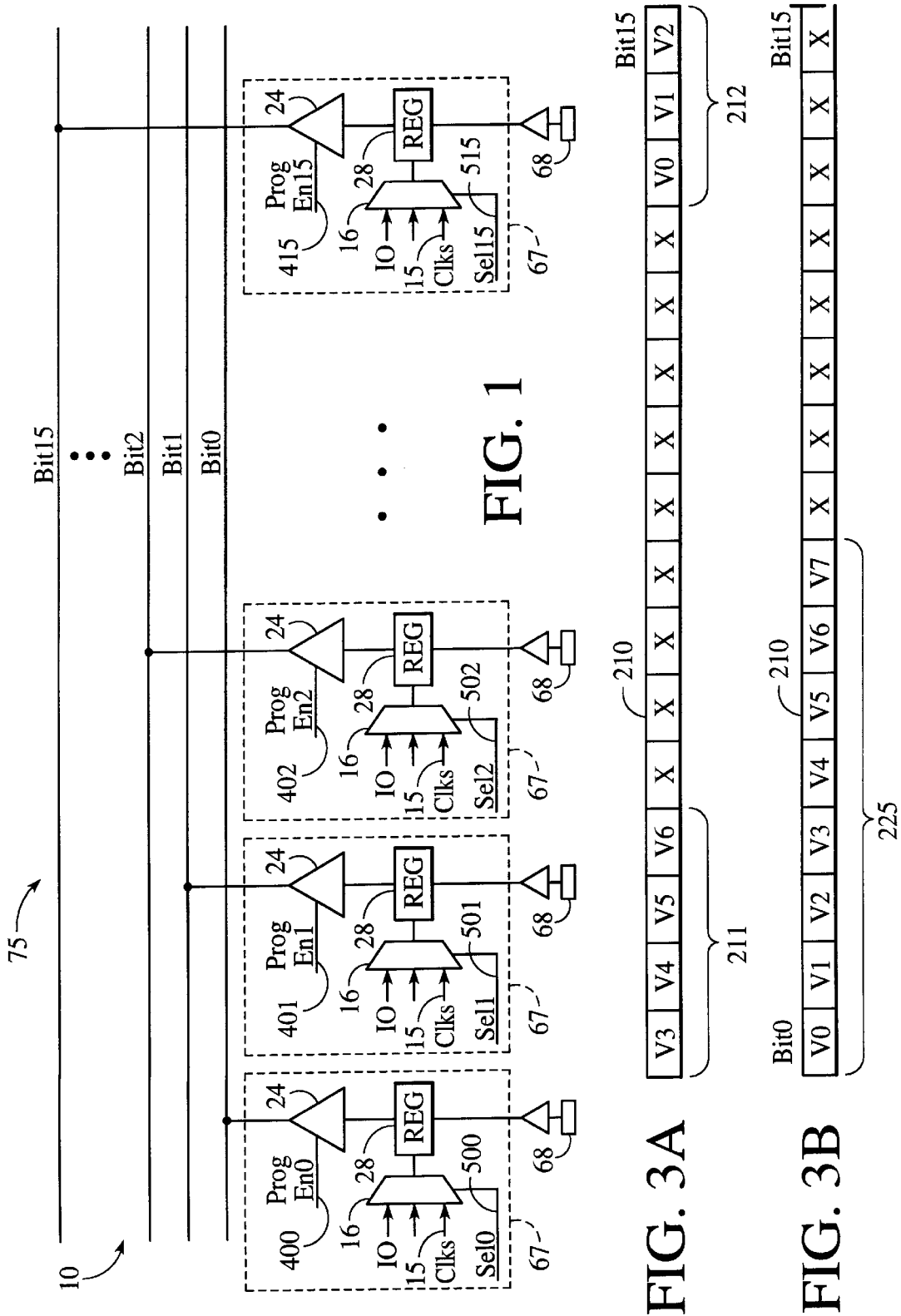
FIG. 1 is a circuit-level schematic diagram of the configuration circuitry for defining a virtual port according to the present invention.
Figure 7:
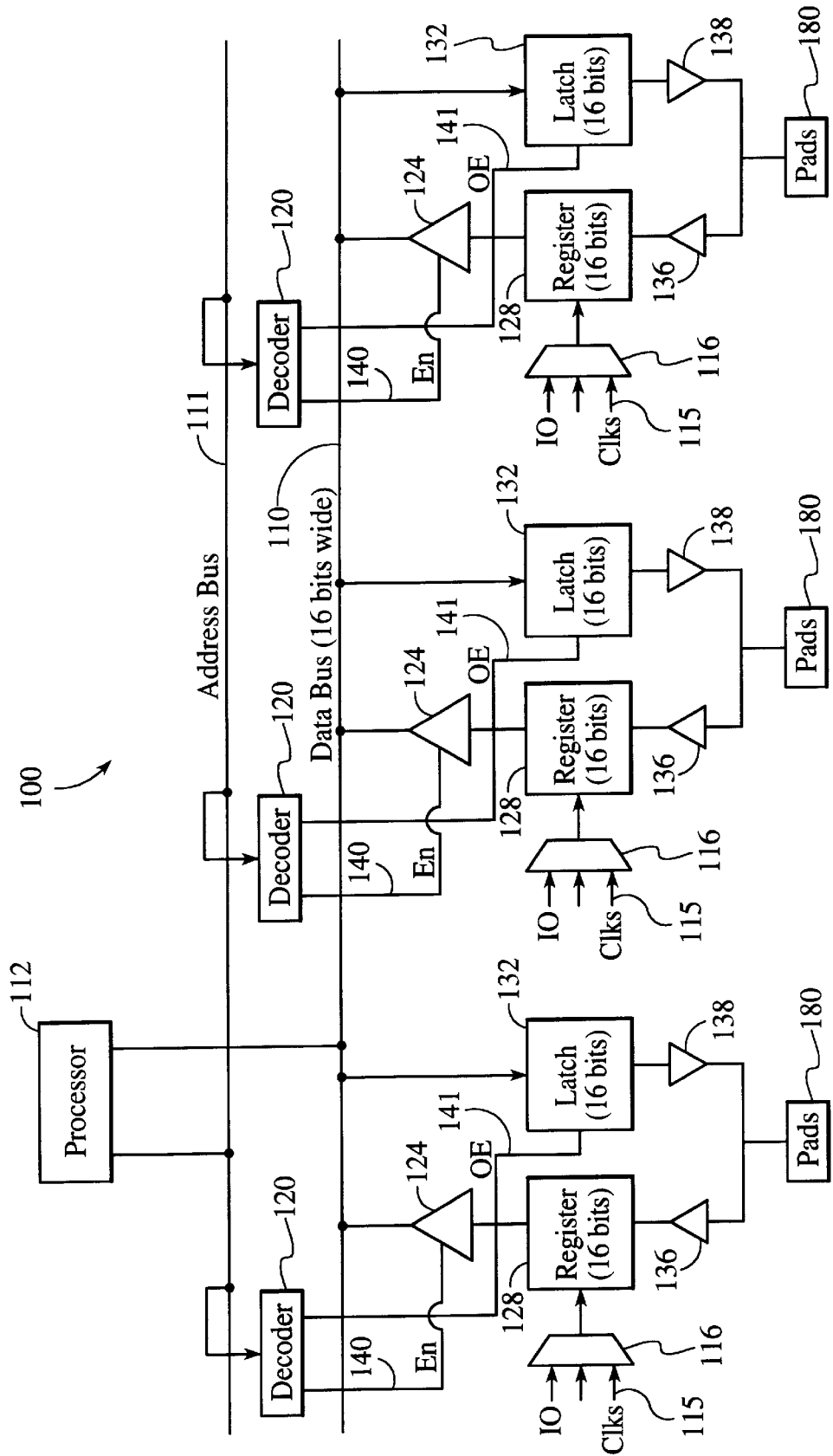
FIG. 7 is a circuit-level schematic diagram of a micro-controller system as known in the prior art.
Figure 8:
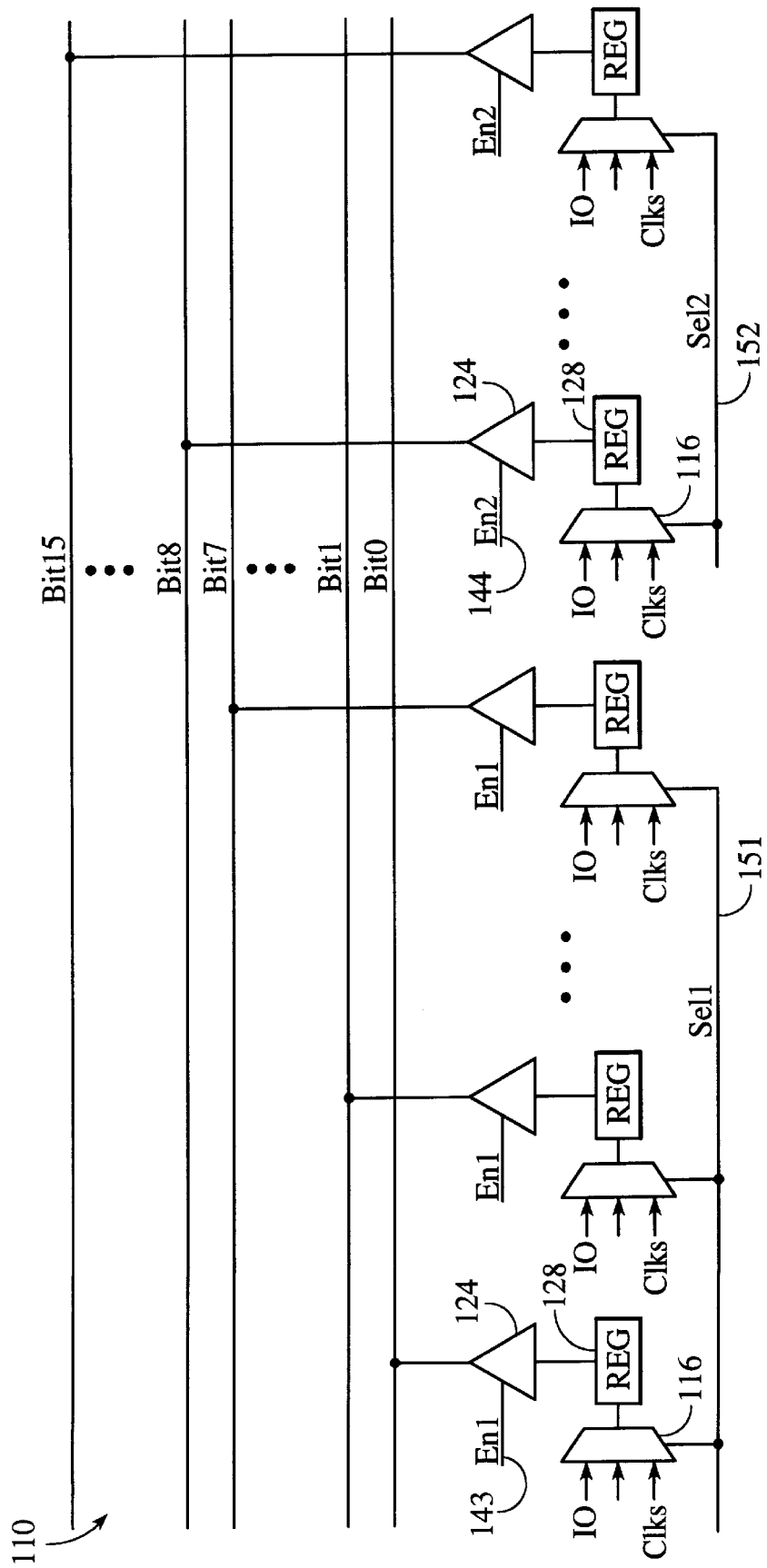
FIG. 8 is a circuit-level schematic diagram of the circuitry for a physical port in the system of FIG. 5.

Referring to FIG. 1, the configuration circuitry 75 of the present invention consists of a plurality of input/output interface elements 67 which are connected between the data bus 10 and the I/O pads 68. In FIG. 1, only the input portion of the I/O interface elements 67 are shown, as configuring of the output portion operates in an essentially similar manner. As in the prior art circuitry of FIG. 7, the output portion may employ a latch activated by an enable signal, instead of a register 28 and buffer 24. Additionally, the output latches and input registers 28 can be substituted with other types of storage means, such as a FIFO register. Each interface element 67 is connected to one of the bits of the data bus 10 and includes an input register 28 which receives data from an I/O pad 68. Clocks 15 and other I/O signals are supplied through a multiplexer 16 having a clock select line 500 to the input register 28. The data passes through a tri-state buffer 24 activated by a programmable enable 400 to the data bus 10. A key difference between the present invention and the circuitry of prior art discussed above is that, as shown in FIG. 1, each bit in the data bus has an interface element 67 that is controlled by a different clock select line and a different programmable enable line. For example, bit 0 has an interface element controlled by select line 500 and by programmable enable signal 400, bit 1 has an interface element controlled by select line 501 and by programmable enable signal 401, bit 2 has an interface element controlled by select line 502 and by programmable enable signal 402 . . . and bit 15 has an interface element controlled by select line 515 and by programmable enable signal 415. All of the interface elements 67 that are activated by a particular select line and programmable enable signal define the bits of a virtual port. In the case of FIG. 1, since there are 16 different select lines 500–515 and programmable enable signals 400–415, it is possible for 16 different virtual ports to be mapped onto a 16 bit bus. This allows for a variety of possible sizes of virtual ports. If, for example, the same select and enable signals were to be supplied to bits 2–7, one could achieve a six-bit wide virtual port. A second set of select and enable signals supplied to bits 9–13 would achieve a second virtual port having a width of five bits. As can be seen, multiple virtual ports with a width of one to 16 bits can be programmed, so long as the total number of these bits is less than the bus width.

Figure 5:
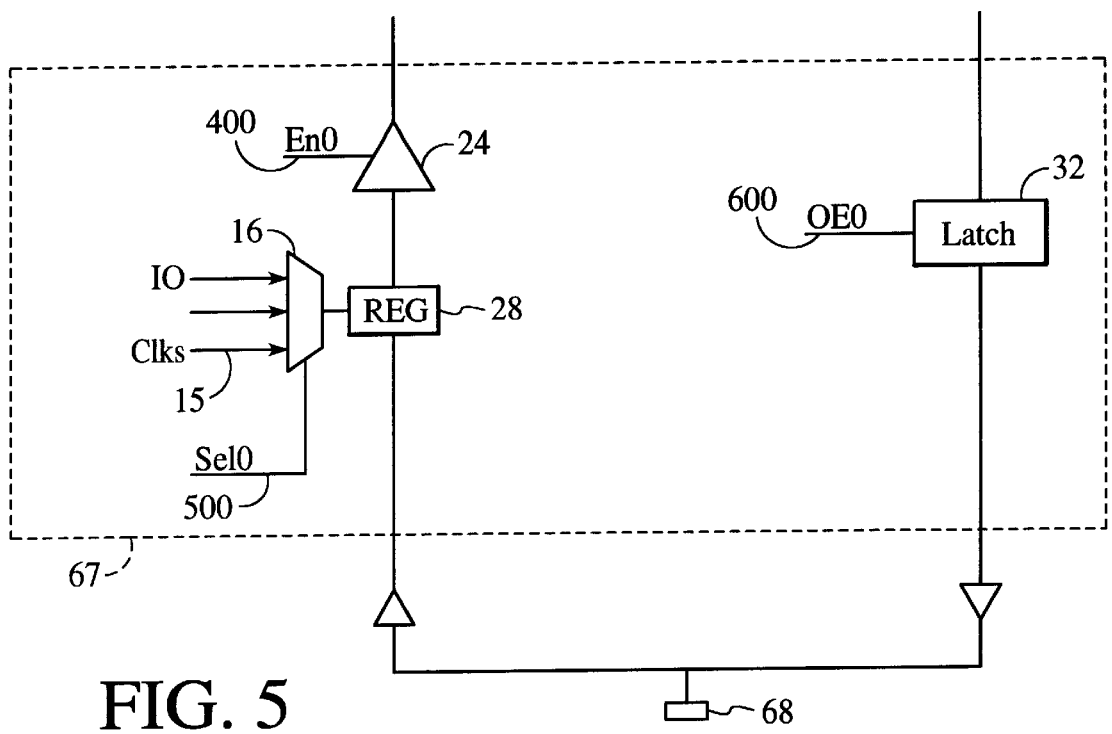
FIG. 5 is a circuit-level schematic diagram of an I/O interface element for the configuration circuitry of FIG. 1.

Referring to FIG. 5, the I/O interface element 67 of FIG. 1 is shown to also include the output portion. The complete I/O interface element 67 includes the input portion, described with reference to FIG. 1 above, and also includes an output latch 32 which receives data from the data bus and passes the data to the I/O pad 68. The output latch is controlled by an output enable signal 600. The I/O interface element 67 for each bit can have a different output enable signal control each latch 32, the same as described above with reference to the enable signals controlling the buffer 24 of the input portion of the circuit.

Figure 2:
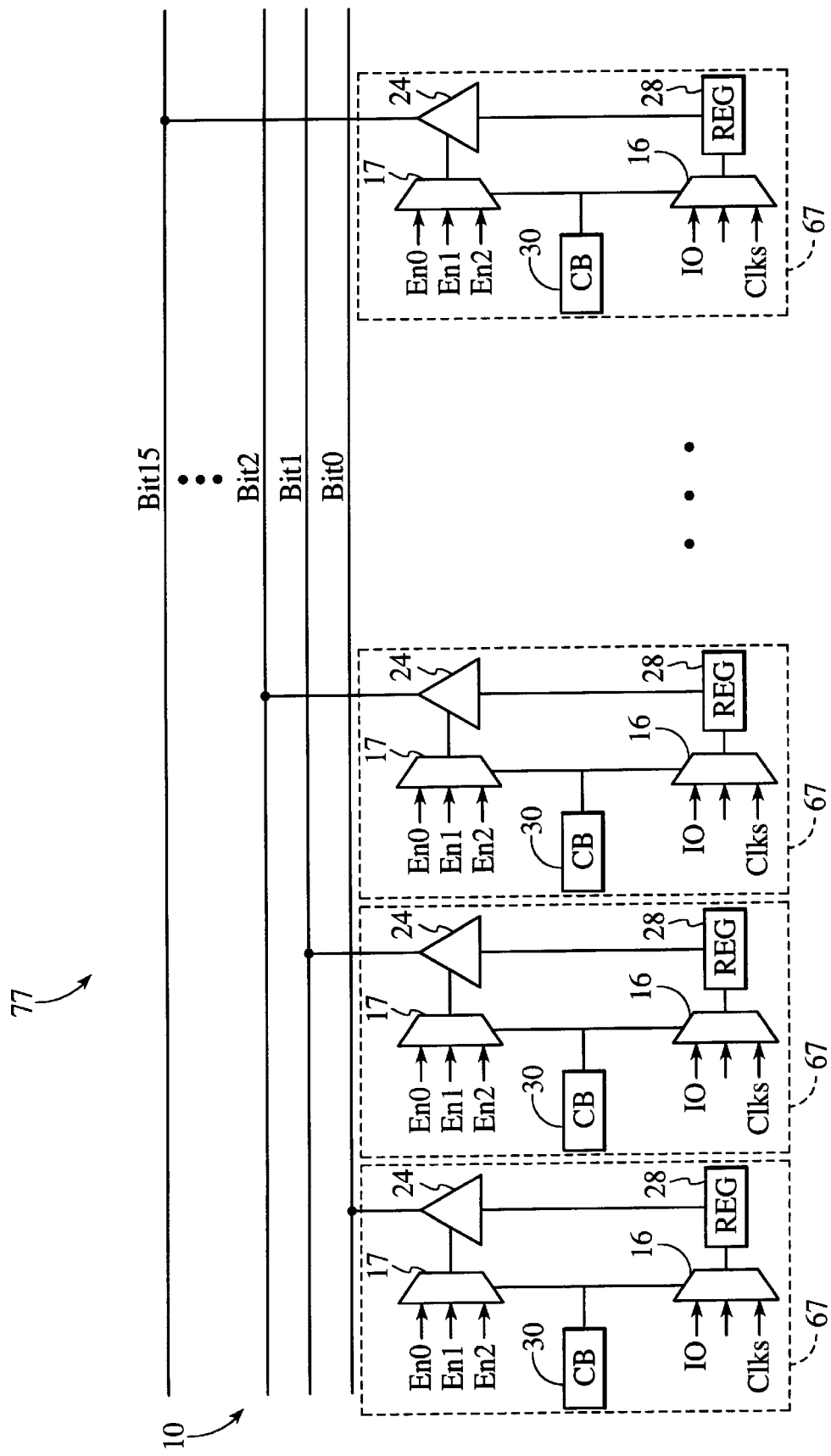
FIG. 2 is a circuit-level schematic diagram of a preferred embodiment of the circuitry of FIG. 1.
Figure 6:
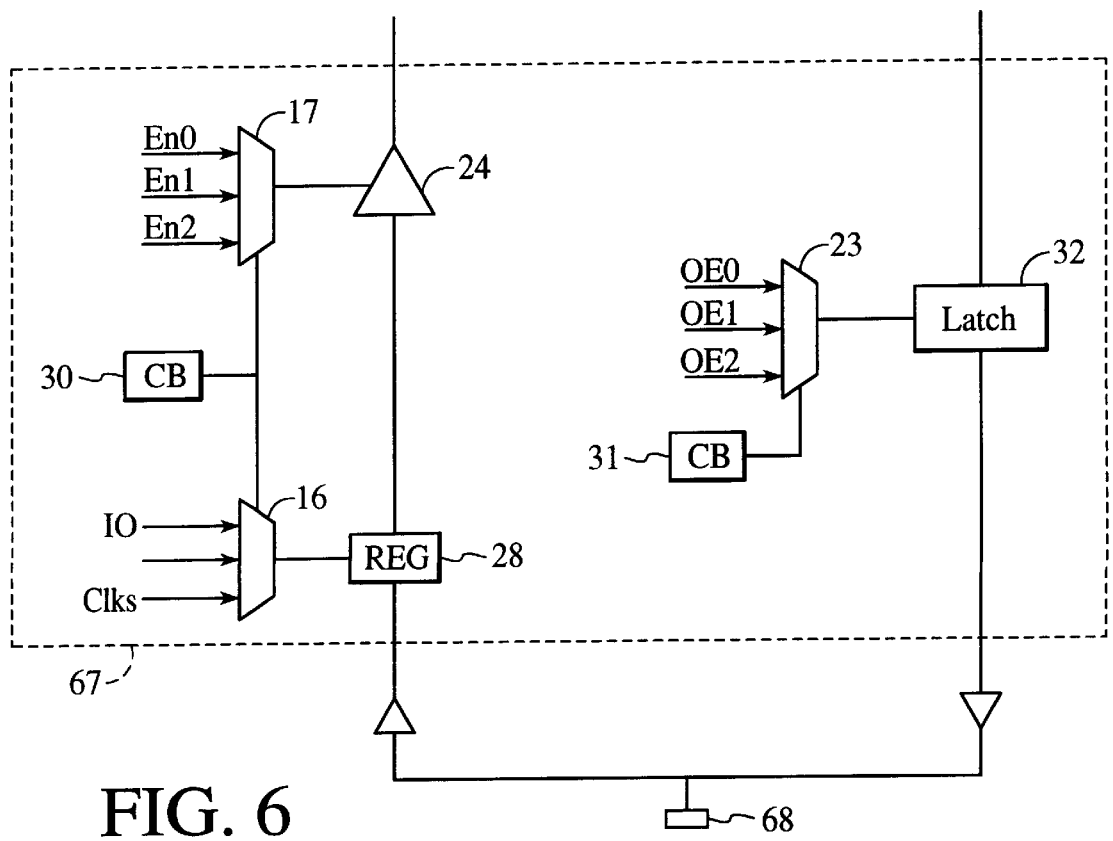
FIG. 6 is a circuit-level schematic diagram of an I/O interface element for the configuration circuitry of FIG. 2.

While the present invention, in its most general form, allows up to 16 virtual ports to be mapped onto a 16-bit bus, to do so would require a programmable decoder per bit, which can be expensive for some applications. Since it is not likely that virtual ports will need to be less than 6 bits wide, in the preferred embodiment of the invention, a more economical manner of implementing the invention could be used wherein there are three programmable enable signals per physical port. Referring to the configuration circuitry 77 of FIG. 2, the tri-state buffer 24 of each I/O interface element 67 is provided with an enable signal which can be one of three possible enable signals En0, En1 or En2. The enable signals En0, En1 and En2 are supplied as data inputs to a multiplexer 17 for selection of the desired enable signal. Configuration bits 30 are supplied as a data select for the multiplexer 17, there being two possible configuration bits per I/O interface element. This embodiment allows for three possible virtual ports within a 16-bit bus, which allows for greater flexibility than the fixed bit-width physical ports of the prior art. In FIG. 6, which shows the complete I/O interface element 67 for the embodiment of FIG. 2, it can be seen that each output latch 32 is provided with an output enable signal that could be one of three possible output enable signals OE0, OE1, or OE2. The output enable signals OE0, OE1, and OE2 are supplied as data inputs to multiplexer 23 for selection of the desired output enable signal. Configuration bits 31 are supplied as a data select for the multiplexer 23. The configuration bits 31 for the multiplexer 23 of the latch 32 can be the same configuration bits as the configuration bits 30 for the multiplexer 17 for buffer 24 or each set of configuration bits 30, 31 can be generated separately. If the configuration bits are generated separately, the configuration bits should be made the same so that matching enable signals (i.e. En0 and OE0) are selected.

In the present invention, if there are two-physical ports available, a virtual port can be created from some higher order bits of one physical port and some low order bits of a second physical port. Thus, virtual ports can be constructed by starting at arbitrary bit positions and having arbitrary widths up to the width of the data bus. While the ability to use adjacent ports to create a virtual port allows ports of different widths to be created without losing the use of any data pins, it is often difficult to use the data in virtual port created from adjacent physical ports. Referring to FIG. 3A, a seven bit virtual port has been created using the last three bits 212 of a first physical port and the first four bits 211 of the next physical port. The data bus 210 would therefore have valid bits V0, V1 and V2 in bits 13–15 and valid bits V3, V4, V5 and V6 in bits 0–3 of the bus, where Vn is the nth bit of the virtual port. Data in this form is difficult to use. However, FIG. 3B shows the data bus 210 after the data has been rotated by three bits. As can be seen, the seven bit virtual port 225 is aligned together in bits 0–6 of the bus 210 and the data can be used much more easily. The rotation of the bits can be carried out by adding a rotation unit to the bus.

Figure 4:
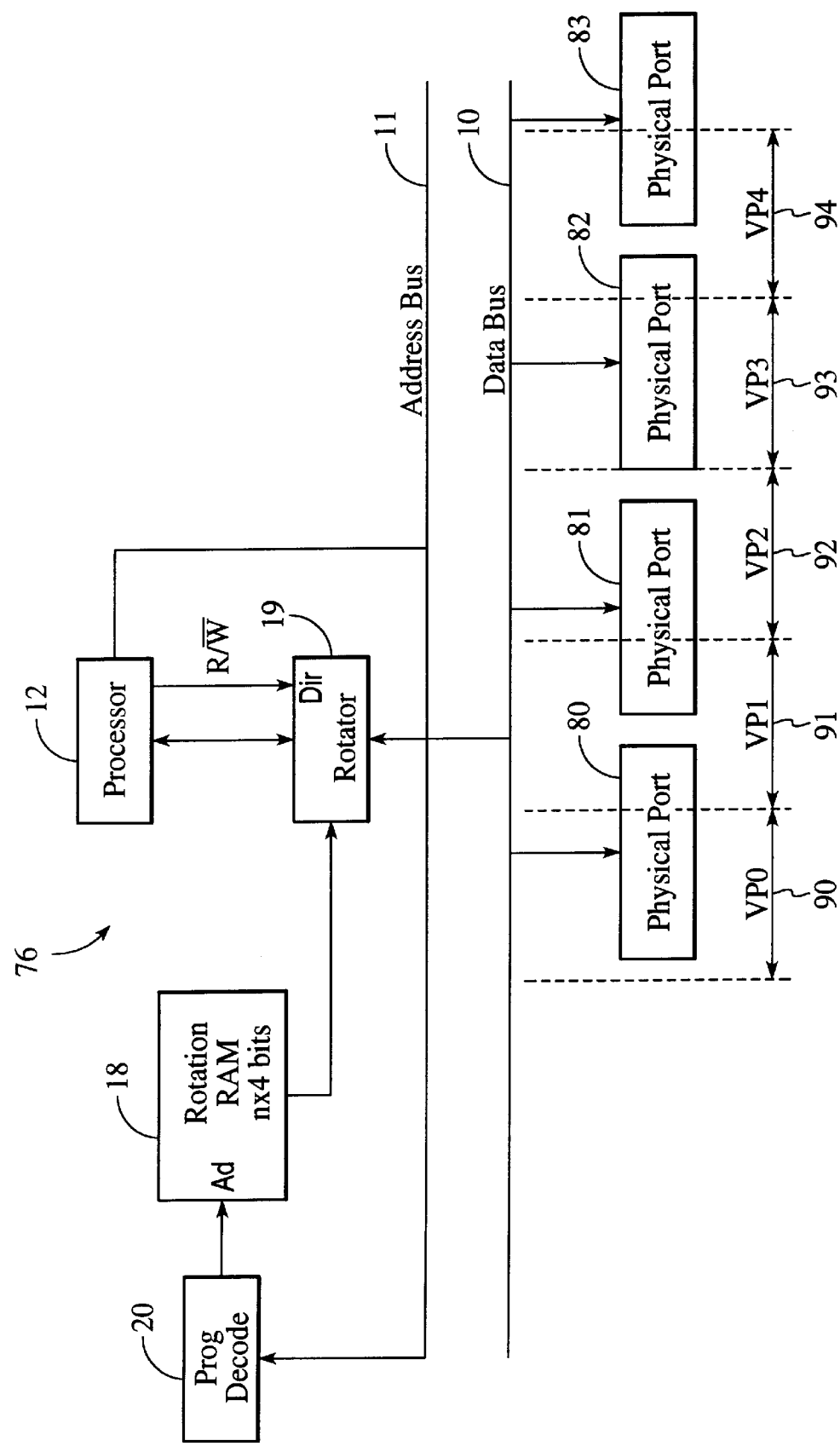
FIG. 4 is a block level schematic diagram of an embodiment of the invention wherein the virtual ports overlap the physical ports and the configuration circuitry includes rotation circuitry.

With reference to FIG. 4, five virtual ports 90–94 have been created, and the virtual ports 90–94 overlap four physical ports 80–83. In order to shift the bits in the virtual port so that the data can be easily used, rotation circuitry has been added to the configuration circuitry 76. The address bus 11 is connected to a program decoder 20 which supplies the address to a rotation RAM 18. The rotation RAM 18 is a (n×4) bit RAM and is connected to a rotator circuit 19 which takes data from the data bus 10 and shifts the data based on commands received from the processor 12. The rotator circuit 19 can be a barrel shifter circuit, or any other type of circuit that is capable of shifting the data by n positions. The decoder 20 for the RAM 18 should be programmed to select the word in the rotation RAM 18 that corresponds to the virtual port. Additionally, the direction of rotation would be reversed when the processor 12 is writing to a virtual port rather than reading from a virtual port.

The present invention allows greater flexibility in the use of the pins of a micro-controller than is achieved in the prior art. Instead of being required to use standardized 8-bit and 16-bit size data ports, the present invention allows for customized virtual ports within the physical port in order to accommodate data having a narrower width without having to give up the use of any of the data pins in the physical port. Also, the present invention allows for the creation of virtual ports which overlap two adjacent physical ports and this allows for even greater versatility in the use of the pins of the micro-controller.

What is claimed is:

1. In an integrated circuit of the type having a bus of a fixed bit width for transmission of information, a plurality of input/output terminals and a plurality of physical ports, each of the physical ports having a fixed bit width and connecting the bus to a corresponding set of input/output terminals, configuration circuitry defining one or more virtual ports comprising:

a plurality of configurable input/output interface elements, each interface element including a storage means and connecting one of a plurality of bits of the bus to a corresponding one of the input/output terminals;

at least one selectable clock connected to the storage means of each interface element;

at least one programmable enable connected to each interface element, wherein multiple clocks and program enables may be connected to different ones of the interface elements and wherein each of the clocks and programmable enables are configured to control the activation of the interface element to which it is connected; and wherein the activated input/output elements make up a virtual port, the virtual port being of an arbitrary bit width that is less than or equal to the fixed bit width of the physical ports.

2. The configuration circuitry of claim 1 wherein the virtual port includes a set of bits that are wholly contained within a single physical port.

3. The configuration circuitry of claim 1 wherein the virtual port includes a first set of bits from a first physical port and a second set of bits from a second physical port.

4. The configuration circuitry of claim 3 further including rotation circuitry for shifting the bits into a desired order.

5. The configuration circuitry of claim 4 wherein the rotation circuitry includes a barrel shifter circuit.

6. The configuration circuitry of claim 1 wherein three separate programmable enables are connected to each interface element within a single physical port.

7. The configuration circuitry of claim 6 wherein a first virtual port is made up of interface elements selected by a first programmable enable, a second virtual port is made up of interface elements selected by a second programmable enable, and a third virtual port is made up of interface elements selected by a third programmable enable.

8. The configuration circuitry of claim 1 wherein the storage means includes an input register.

9. The configuration circuitry of claim 1 wherein the storage means includes an output latch.

10. The configuration circuitry of claim 1 wherein the storage means includes a FIFO register.

11. An integrated circuit comprising:

a bus having a fixed bit width for transmission of information;

a plurality of input/output terminals;

a plurality of physical ports, each of the physical ports having a fixed bit width and having a plurality of configurable input/output interface elements, each interface element including a storage means and connecting one of a plurality of bits of the bus to a corresponding one of the input/output terminals;

at least one selectable clock connected to the storage means of each interface element;

at least one programmable enable paired with the clock and connected to each interface element, wherein multiple clocks and program enables may be connected to different ones of the interface elements and wherein each of the clocks and programmable enables are configured to control the activation of the interface element to which it is connected; and wherein the activated input/output elements make up a virtual port, the virtual port being of an arbitrary bit width that is less than or equal to the fixed bit width of the physical ports.

12. The integrated circuit of claim 11 wherein the virtual port includes a set of bits that are wholly contained within a single physical port.

13. The integrated circuit of claim 11 wherein the virtual port includes a first set of bits from a first physical port and a second set of bits from a second physical port.

14. The integrated circuit of claim 13 further including rotation circuitry for shifting the bits into a desired order.

15. The integrated circuit of claim 14 wherein the rotation circuitry includes a barrel shifter circuit.

16. The integrated circuit of claim 11 wherein three separate programmable enables are connected to each interface element within a single physical port.

17. The integrated circuit of claim 16 wherein a first virtual port is made up of interface elements selected by a first programmable enable, a second virtual port is made up of interface elements selected by a second programmable enable, and a third virtual port is made up of interface elements selected by a third programmable enable.

18. The configuration circuitry of claim 11 wherein the storage means includes an input register.

19. The configuration circuitry of claim 11 wherein the storage means includes an output latch.

20. The configuration circuitry of claim 11 wherein the storage means includes a FIFO register.

* * * * *